(12) United States Patent  
Albrecht et al.

(10) Patent No.: US 7,633,982 B2
(45) Date of Patent: Dec. 15, 2009

(54) OPTICALLY PUMPED SURFACE EMITTING SEMICONDUCTOR LASER DEVICE

(75) Inventors: Tony Albrecht, Bad Abbach (DE); Peter Brick, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 259 days.

(21) Appl. No.: 11/140,862

(22) Filed: May 31, 2005

(65) Prior Publication Data

US 2006/0018354 A1    Jan. 26, 2006

(30) Foreign Application Priority Data

May 28, 2004   (DE) ........................ 10 2004 026 115
Jul. 30, 2004   (DE) ........................ 10 2004 036 963

(51) Int. Cl.
  *H01S 5/00*   (2006.01)
(52) U.S. Cl. .............................. 372/46.01; 372/46.011; 372/66; 372/25; 372/29.014
(58) Field of Classification Search .................. 372/19, 372/29.01, 29.015, 38.06, 38.07, 43.01, 50.1, 372/50.11, 70, 75
See application file for complete search history.

(56) References Cited

U.S. PATENT DOCUMENTS

| 5,182,758 | A | * | 1/1993 | Taneya et al. ............ 372/46.01 |
| 5,991,318 | A |   | 11/1999 | Caprara et al. |
| 6,222,869 | B1 | * | 4/2001 | Marshall et al. ................ 372/75 |
| 6,366,595 | B1 | * | 4/2002 | Bowler ..................... 372/46.01 |
| 6,480,516 | B1 |   | 11/2002 | Shimizu |
| 6,608,850 | B1 | * | 8/2003 | Inaba ....................... 372/45.01 |
| 2002/0001328 | A1 | * | 1/2002 | Albrecht et al. ................ 372/50 |
| 2002/0075935 | A1 | * | 6/2002 | Clayton ....................... 372/75 |
| 2004/0076204 | A1 | * | 4/2004 | Kruschwitz et al. ........... 372/39 |
| 2004/0041538 | A1 |   | 7/2004 | Schmidt et al. |

FOREIGN PATENT DOCUMENTS

| DE | 100 26 734 A1 | 12/2001 |
| DE | 102 43 545 B1 | 4/2004 |
| WO | WO 03/094311 A2 | 11/2003 |
| WO | WO 2005/048424 A1 | 5/2005 |

OTHER PUBLICATIONS

Search Report dated Apr. 13, 2007 issued for the corresponding European Application No. EP 05 00 6600.

* cited by examiner

*Primary Examiner*—Minh-Loan T Tran
*Assistant Examiner*—Fei Fei Yeung Lopez
(74) *Attorney, Agent, or Firm*—Cohen Pontani Lieberman & Pavane LLP

(57) ABSTRACT

A surface emitting semiconductor laser device, having at least one monolithically integrated pump radiation source (20), in which the pump radiation source (20) has at least one edge emitting semiconductor structure (9) that is suitable for emission of electromagnetic radiation whose intensity profile transversely with respect to the emission direction (z) of the semiconductor structure follows a predeterminable curve. Such a surface emitting semiconductor laser device emits electromagnetic radiation having a particularly good beam quality.

14 Claims, 5 Drawing Sheets

OPTICALLY PUMPED SURFACE EMITTING SEMICONDUCTOR LASER DEVICE

RELATED APPLICATIONS

This patent application claims the priority of German patent application nos. 10 2004 026 115.1 and 10 2004 036 963.1 filed May 28, 2004 and Jul. 30, 2004, respectively, the disclosure content of which is hereby incorporated by reference.

FIELD OF THE INVENTION

The invention relates to an optically pumped surface emitting semiconductor laser device.

BACKGROUND OF THE INVENTION

Copending U.S. application Ser. No. 09/824,086 describes an optically pumped surface emitting semiconductor laser device having at least one radiation-generating quantum well structure and at least one pump radiation source. In this case, the pump radiation source serves for optically pumping the quantum well structure. The The document U.S. Pat. No. 5,991,318 describes an optically pumped vertical resonator semiconductor laser having a monolithic surface emitting semiconductor layer structure. In the case of this known device, the optical pump radiation, the wavelength of which is less than that of the laser radiation generated, is supplied by an edge emitting semiconductor diode. The edge emitting semiconductor laser diode is arranged externally in such a way that the pump radiation is radiated obliquely from the front into the amplifying region of the surface emitting semiconductor layer structure.

SUMMARY OF THE INVENTION

It is an object of the present invention to provide an optically pumped surface emitting semiconductor laser device which emits electromagnetic radiation having a particularly good beam quality.

This and other objects are attained in accordance with one aspect of the present invention directed to a surface emitting semiconductor laser device, having at least one monolithically integrated pump radiation source, in which the pump radiation source has at least one edge emitting semiconductor structure that is suitable for emission of electromagnetic radiation whose intensity profile transversely with respect to the emission direction (z) of the semiconductor structure follows a predeterminable curve.

The semiconductor laser structure preferably contains at least one structure suitable for generating electromagnetic radiation. This surface emitting radiation-generating structure is particularly preferably a quantum well structure. The radiation-generating structure is preferably optically pumped by at least one pump radiation source. The pump radiation source is particularly preferably an edge emitting semiconductor structure. By way of example, the pump radiation source may be an edge emitting broad-stripe laser.

Pump radiation source and radiation-generating surface emitting structure are preferably grown epitaxially on a common substrate. That is to say that the pump radiation source is preferably integrated monolithically into the semiconductor laser device. The layer thicknesses of the individual semiconductor layers can be set very precisely during the epitaxy, so that it is advantageously possible to achieve a high positioning accuracy of the edge emitting semiconductor structure with respect to the surface emitting radiation-generating structure. The surface emitting structure and the pump radiation source are particularly preferably arranged next to one another on the substrate in such a way that at least one active zone of the pump radiation source, which is suitable for generating electromagnetic radiation, and the quantum well structure lie at the same height above the substrate. What is thereby achieved is that pump radiation is coupled laterally into the quantum well structure during operation of the semiconductor laser device. This means that the emission direction of the pump radiation runs essentially parallel to the substrate surface and essentially vertically with respect to the emission direction of the laser beam generated by the surface emitting semiconductor laser structure.

The intensity profile of the pump radiation source transversely with respect to the emission direction of the pump radiation source preferably follows a predeterminable curve. That is to say that it is possible to set a desired intensity profile transversely with respect to the emission direction, i.e., the lateral direction, in the case of the pump radiation source. The surface emitting semiconductor laser device thus preferably contains at least one monolithically integrated pump radiation source, in which the pump radiation source has at least one edge emitting semiconductor structure that is suitable for emission of electromagnetic radiation whose intensity profile transversely with respect to the emission direction follows a predeterminable curve.

The surface emitting radiation-generating structure and the active zone of the pump radiation source preferably have different radiation-emitting layers which are designed such that the wavelength of the radiation emitted by the pump radiation source is less than the wavelength of the radiation generated by the surface-emitting structure. This wavelength difference is necessary since otherwise, given an identical pump and emission wavelength, the radiation generated by the surface emitting structure would be absorbed in the same way as the pump radiation in the surface emitting structure. The efficiency of the semiconductor laser device would decrease greatly as a consequence.

The semiconductor laser device makes use of the idea that the spatial distribution of charge carriers in the surface emitting structure, the so-called gain profile of the surface emitting structure, is determined in particular by the pump profile with which the structure is pumped. That is to say that the profile of the power absorbed in the surface emitting structure determines the spatial distribution of charge carriers in the surface emitting structure. On account of the fact that the intensity profile of the pump radiation source transversely with respect to the emission direction follows a predeterminable curve, it is advantageously possible to generate a desired gain profile in the surface emitting structure. In this case, it is advantageous, moreover, that the beam profile of the laser beam emitted by the semiconductor laser device is determined by the gain profile in the surface emitting structure. This is because the gain profile determines what modes can establish oscillation in the surface emitting laser. In this way, it particularly advantageously emerges, moreover, that the beam profile of the surface emitting laser can be set by means of the intensity profile of the pump radiation source. In particular, by means of a suitable pump profile, it is possible, in a targeted manner, to address a desired transverse mode in the surface emitting laser, so that the surface emitting laser establishes oscillation principally in this mode.

Particularly advantageously, the intensity profile of the pump radiation source in this case has at least one local maximum. Since the gain profile in the surface emitting structure can be spatially influenced by the intensity profile of the pump radiation source, a maximum in the intensity profile of the pump radiation source effects a maximum in the gain profile and thus in the beam profile of the surface emitting laser. The power density of the beam generated by the surface emitting laser can be spatially controlled in this way.

In one preferred embodiment, the intensity profile of the pump radiation source, in the lateral direction, proceeds in the manner of a bell-shaped curve. Particularly preferably, it follows approximately a Gaussian bell-shaped curve. In this context, approximately means that a mathematically exact Gaussian profile can hardly be established on account of the customary fluctuations in the production of the pump radiation source and during operation of the pump radiation source, for example caused by temperature fluctuations. Moreover, on account of the spatial limitation of the pump radiation source, the intensity profile at the edge of the pump radiation source cannot be approximated asymptotically to a constant value, as would be the case with a mathematically exact Gaussian profile. Rather, the intensity profile at the edge of the pump radiation source suddenly falls to zero. The maximum of the intensity profile is preferably localized in the center or in the vicinity of the center of the pump radiation source, the intensity profile preferably proceeding symmetrically with respect to a center axis that extends along the emission direction of the edge emitter. The intensity profile is reproduced particularly well there by the bell-shaped curve.

Such a Gaussian intensity profile proves to be particularly advantageous since it is thereby possible, with the emission of one or more pump radiation sources, to generate a radially symmetrical gain profile in the surface emitting structure. This gain profile is particularly preferably Gaussian. This is because what can advantageously be achieved as a result is that primarily the transverse fundamental mode establishes oscillation in the surface emitting laser.

A laser beam emitted by the surface emitting structure with a Gaussian beam profile of particularly high beam quality is advantageously produced. That is to say that the beam has a radially symmetrical beam profile and is distinguished by an $M^2$ value of approximately 1. The beam is further distinguished by a particularly high power density. On account of the fact that the fundamental mode is excited by the Gaussian pump radiation in a targeted manner, the surface emitting laser can also be pumped with high power without higher transverse modes appreciably establishing oscillation. The particularly advantageous radially symmetrical beam profile of the surface emitting laser is thus preserved even at relatively high pump rates.

This beam profile proves to be particularly advantageous for example in the case of materials processing. It is possible in this case to effect laser welding e.g. at defined, small areas with a high power density. The beam form proves to be particularly advantageous for optical representation as well, for example by means of laser projection. Particularly sharply demarcated spots of high intensity can be generated in this case, as a result of which it becomes possible to represent brilliant, high-resolution images. The radially symmetrical beam form also proves to be particularly suitable for coupling the laser beam into an optical waveguide. The high power density of the semiconductor laser device described can ensure that a beam amplification is necessary less often during data transmission. It thus becomes possible to produce particularly cost-effective data transmission links.

In one preferred embodiment, means for inhomogeneous energization of specific regions of the active zone of the pump radiation source are provided, the inhomogeneity relating to a direction transverse with respect to the emission direction of the semiconductor structure. That is to say that in a direction transversely with respect to the emission direction of the pump radiation source, the current density in the active zone is not constant or approximately constant. Instead, means are provided which lead to an inhomogeneous distribution of the current density in the lateral direction in the active zone.

In this case, it is not necessary for the energization transversely with respect to the emission direction to be inhomogeneous at every location along the emission direction of the semiconductor structure. Instead, it is also possible for there to be homogeneously energized partial regions in the active zone. This means that the current density in the active zone does not change or substantially does not change in these regions transversely with respect to the emission direction.

An inhomogeneous energization of the active zone of the pump radiation source advantageously results in an inhomogeneous charge carrier density distribution in the lateral direction, transversely with respect to the emission direction. It is thus advantageously possible, by means of gain guiding, to model a desired intensity profile of the generated radiation transversely with respect to the emission direction, which intensity profile is composed of a superposition of a plurality of transverse modes.

In a further embodiment, means for inhomogeneous energization of the active zone are provided in such a way that the current density in the active zone transversely with respect to the emission direction, averaged over the resonator length of the semiconductor structure, follows a predeterminable curve. The resonator of the semiconductor structure extends in the emission direction and is delimited for example by reflective areas at the ends of the edge emitting semiconductor structure which run perpendicularly to the emission direction.

The profile of the current density in the active zone, averaged over the resonator length, follows substantially a predeterminable curve. Substantially a predeterminable curve means that fluctuations in the material composition or the operating temperature have the effect that the energization does not follow the predetermined curve exactly, but rather deviates from it up to a specific degree. Deviations from the desired curve may occur primarily at the edges of the semiconductor structure, on account of the finite extent of the pump radiation source. However, the actual profile of the inhomogeneous energization is reproduced well by the curve primarily in the center of the semiconductor structure.

The inhomogeneous energization of the active zone described is possible for example by means of a suitable structuring of contact-connected areas on at least one surface of the pump radiation source. Current is impressed into the active zone via the contact-connected areas. The contact-connected areas are arranged on the surface of the pump radiation source for example in such a way that current is impressed into the active zone only via specific regions of the surface. The inhomogeneity of the arrangement and extent of the contact-connected areas causes an inhomogeneity of the current density in the active zone. In this case, it must be taken into consideration that the current density in the active zone of the semiconductor structure does not have to be identical to the current density at the surface of the pump radiation source. Rather, the impressed current may expand for example on the way from surface toward the active zone. However, such current expansion can be taken into account by means of correspondingly dimensioned contact-connected areas on the surface. Thus, it is possible, by way of example, to choose the contact-connected areas in such a manner that a region having a desired form and size in the active zone is energized by the expansion of the current on its way from the surface to the active zone.

In a further embodiment, means for energization of the active zone of the semiconductor structure are provided, so that the current density in the active zone transversely with respect to the emission direction of the pump radiation source follows a predeterminable curve. In this exemplary embodiment, then, the current density follows a predeterminable curve at every location along the emission direction of the active zone in the lateral direction. However, it is not necessary for the curve to precisely reproduce the profile of the current density. Deviations from the predetermined profile may again occur primarily at the edges of the active zone.

In a further preferred embodiment, means for energization of the active zone are provided in such a way that the current density transversely with respect to the emission direction follows a curve with at least one maximum. In this case, it is possible both for the current density to follow such a curve averaged over the resonator length and for the current density to follow said curve at every location transversely with respect to the emission direction. The current density preferably proceeds in the manner of a bell-shaped curve; the current density particularly preferably proceeds like a Gaussian bell-shaped curve.

The output power of the edge emitter depends to an approximation on the current density in the lateral direction (y), transversely with respect to the emission direction, in accordance with the following formula:

$$p(y)=\eta(j(y)-j_{th})$$

In this case, $\eta$ is a constant that depends for example on the materials used or the geometry of the active zone, and $j_{th}$ is a threshold current density of the edge emitter. If a current is then impressed into the active zone of the edge emitter, so that the current density to an approximation follows:

$$j(y)=j_{th}+C_0 \exp(-y^2/w^2)$$

the result advantageously is an intensity profile of the emitted radiation of the edge emitter transversely with respect to the emission direction which follows a Gaussian bell-shaped curve. In this case, $C_0$ is a constant and w is the width of the Gaussian curve. In this case, the maximum of the Gaussian bell preferably lies within the active zone. Particularly preferably, the maximum is situated in the center of the active zone, on a center axis extending along the emission direction. In the lateral direction, the profile of the current density is thus preferably symmetrical with respect to the center axis.

Furthermore, it is advantageously possible for a different desired intensity profile of the pump radiation source to be generated through a suitable choice of the profile of the current density in the y direction. It is thus possible to generate a desired beam profile in the surface emitting structure in a targeted manner by means of the choice of the current density in the pump laser.

In a further preferred embodiment, the edge emitting semiconductor structure has, on at least one of its surfaces, an area which is contact-connected in such a way that the proportion of the total area of the surface made up by the contact-connected area varies when moving over the surface transversely with respect to the emission direction of the semiconductor structure from the outside toward the center. The proportion made up by the contact-connected area may continuously increase or decrease, for example, when moving over the surface. It is also possible for the proportion made up by the contact-connected area to increase and decrease alternately. What is important is that the surface is not homogeneously contact-connected over the whole area, but rather only specific, selected regions of the surface are contact-connected. Current is impressed into the active zone via the contact-connected area.

Preferably, the contact-connected area is provided by at least two striplike contact-connected regions having a specific width, i.e. the contact-connected area is provided by strips via which current can be impressed into the active zone of the pump radiation source. The strips preferably have a specific, predetermined width. The strips are particularly preferably situated at specific, predetermined distances with respect to one another. The strips run for example along the emission direction of the semiconductor structure. They preferably extend along the entire resonator length of the edge emitter. The contact-connected area is particularly preferably provided by a multiplicity of striplike contact-connected regions.

In another embodiment, the width of the contact-connected regions decreases from an axis of the semiconductor structure that extends parallel to the emission direction outward. The axis may run for example through the center of the surface emitting semiconductor structure. The axis preferably extends through the center of the widest region. The contact-connected regions then become thinner from the axis outward toward the edges of the pump radiation source.

In another embodiment, the distance between the regions may increase from the axis outward. In this case, the width of the regions may remain constant or decrease. The width of the regions particularly preferably follows approximately a Gaussian distribution. This is particularly advantageous since, in this way, it is possible to achieve a Gaussian energization of the active zone transversely with respect to the emission direction and thus, as set forth above, a Gaussian intensity distribution. The width of the strips may advantageously be chosen in such a way as to take account of an expansion of the current from the contact-connected regions toward the active zone. That is to say that the strips are chosen to be somewhat narrower than the desired width of the region to be energized in the active zone.

In another embodiment, the edge emitting semiconductor structure has, at at least one of its surfaces, at least two non-contact-connected regions. The non-contact-connected regions are in this case configured in such a way that the width of the non-contact-connected regions decreases from the edge of the surface toward the center axis.

DETAILED DESCRIPTION OF THE DRAWINGS

In the exemplary embodiments and figures, identical or identically acting constituent parts are in each case provided with the same reference symbols. The constituent parts illustrated and also the size relationships among the constituent parts are not to be regarded as true to scale. Rather, some details of the figures have been illustrated with an exaggerated size in order to afford a better understanding.

Figure 1:
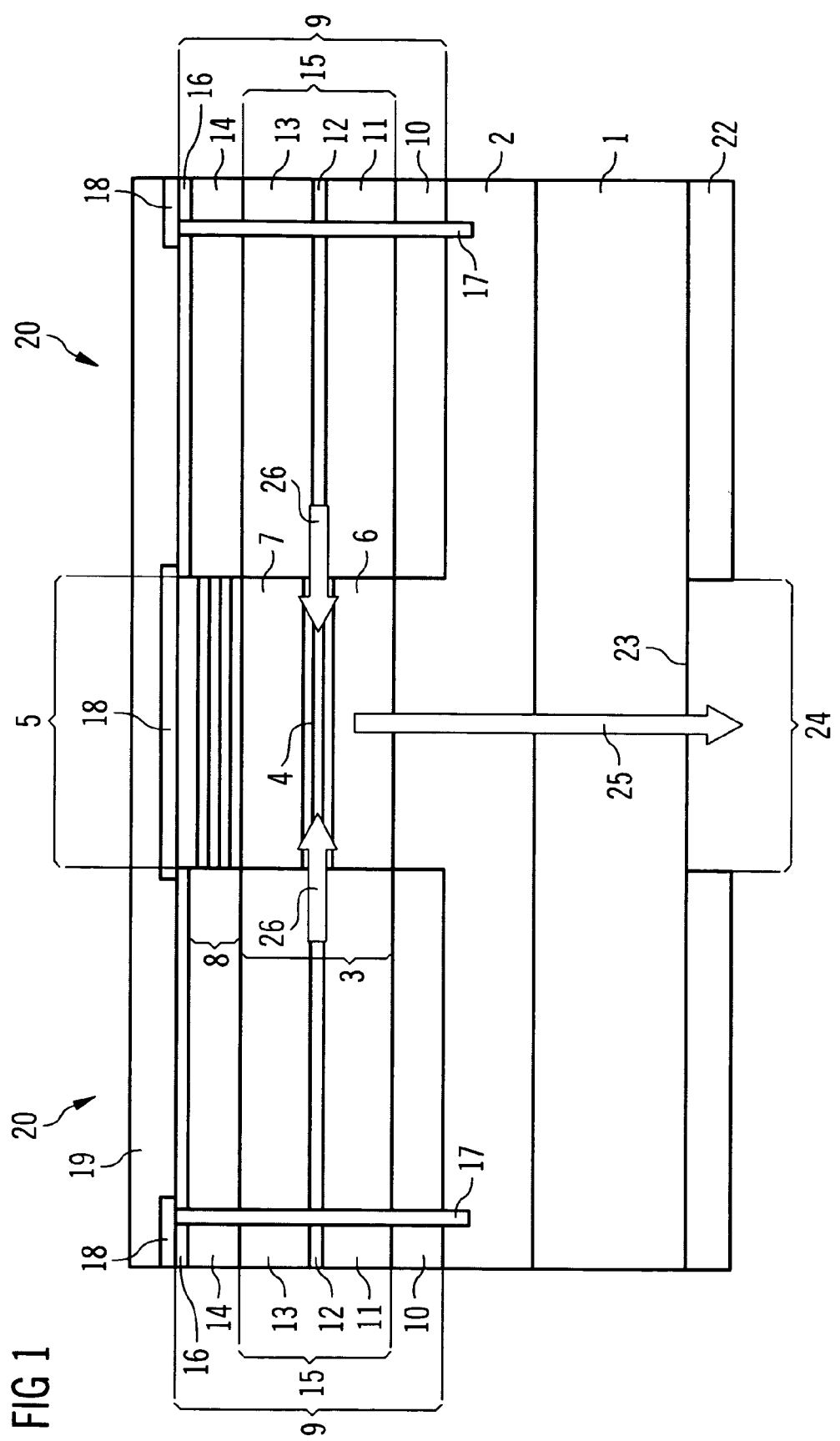
FIG. 1 shows a schematic illustration of a cross section taken through a first exemplary embodiment of the surface emitting semiconductor laser device.

FIG. 1 shows a schematic cross sectional illustration of an exemplary embodiment of the surface emitting semiconductor laser device described. The device is composed of a surface emitting laser region 5 and a pump radiation source 20. The surface emitting laser region 5 is the entire region of the device where vertically directed laser radiation is produced, and it includes semiconductor laser structure 3 and mirror 8. A buffer layer 2 is applied to a substrate 1. The buffer layer 2 has applied to it, centrally above the substrate, the surface emitting semiconductor laser structure 3 which includes a radiation-generating quantum well structure 4, a first n-doped cladding layer 6 situated directly on the buffer layer 2 and a p-doped cladding layer 7 arranged on the quantum well structure 4. The quantum well structure 4 has a multiplicity of quantum wells, by way of example.

In the context of the application, the designation quantum well structure encompasses any structure in which charge carriers experience a quantization of energy states as a result of confinement. In particular, the designation quantum well structure does not comprise any indication about the dimensionality of the quantization. It thus encompasses, inter alia, quantum wells, quantum wires and quantum dots and any combination of these structures.

A Bragg mirror 8, for example, is deposited above the surface emitting semiconductor laser structure 3.

In the vicinity of the surface emitting laser region 5 is a pump radiation source 20 which includes an edge emitting semiconductor laser structure 9, contact layers 19 and 22, and mask layer 18. The edge emitting semiconductor laser structure 9 is deposited on the buffer layer 2, for example, and is suitable for generating radiation whose wavelength lies below the wavelength of the radiation generated in the surface emitting semiconductor laser structure 3. The edge emitting semiconductor structure 9 may be composed e.g. of a first n-doped cladding layer 10, a first n-doped waveguide layer 11, an active zone 12, a p-doped second waveguide layer 13 and a p-doped second cladding layer 14. The active zone 12 contains a radiation-generating structure, for example a quantum well structure with one or a plurality of quantum wells. A p-doped covering layer 16, for example, is arranged on the second cladding layer 14.

The radiation emitting region 15 is arranged at approximately the same height level as the radiation-generating surface emitting structure 4; preferably, the active zone 12 and the quantum well structure 4 are situated at the same height level above the substrate 1.

All of the semiconductor layers are produced for example by means of metal organic vapor phase epitaxy (MOVPE) and may be formed for example on a substrate 1 containing gallium arsenide, in one of the following material systems: InGaAlAs, InAlGaN, InGaAsP, InGaAlP.

End mirrors 17 running perpendicular to the layers of the edge emitting semiconductor structure 9 are situated in proximity to the outer edge of the edge emitting semiconductor structure 9. Said end mirrors are produced after the growth of the edge emitting semiconductor structure 9, for example, by means of etching corresponding trenches and subsequent filling with highly reflective material. As an alternative, the end mirrors 17 may be produced by cleaving the wafer along crystal planes. These are then necessarily not arranged in the chip, in contrast to the illustration in FIG. 1, but rather are formed by the cleaved chip side face.

Figure 3:
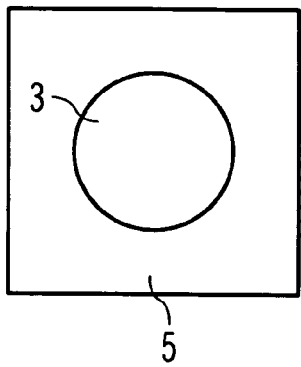
FIG. 3 shows a schematic illustration of a plan view of a semiconductor laser device with an edge emitting semiconductor structure according to the prior art.
Figure 4:
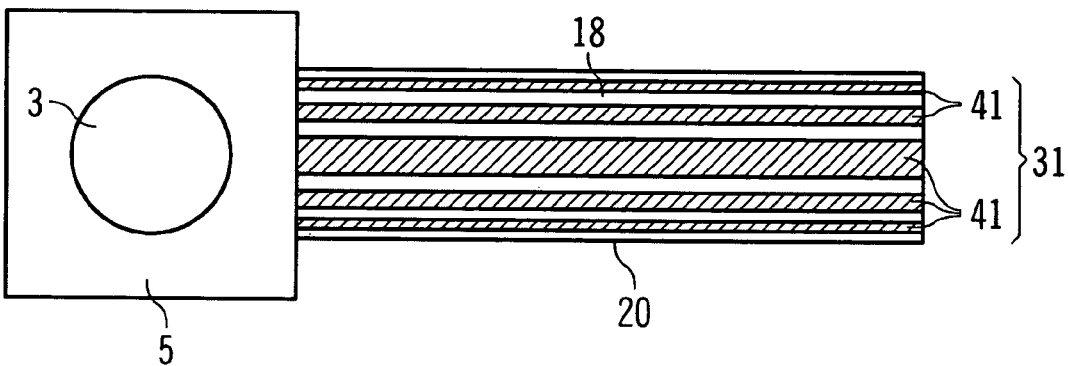
FIG. 4 shows a schematic illustration of a plan view of a semiconductor laser device with regions that are contact-connected in striplike fashion.
Figure 5:
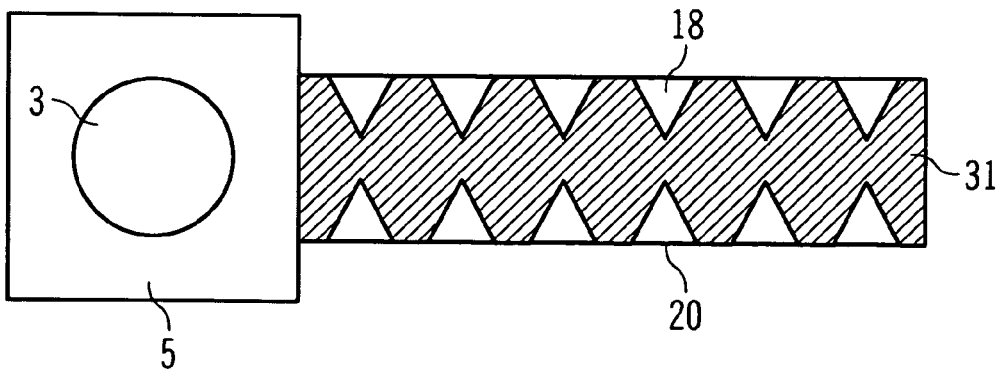
FIG. 5 shows a schematic illustration of a plan view of a semiconductor laser device with contact-connected regions averaged over the resonator length.

Situated on the free surfaces of the covering layer 16 and of the Bragg mirror 8 is an electrically insulating mask layer 18, which contains silicon nitride, aluminum oxide or silicon oxide, for example, and defines the contact-connected regions 31 (cf. FIGS. 3 to 5). A p-type contact layer 19, e.g. a contact metalization, is applied on the mask layer 18 and the cutouts thereof on the covering layer 16, by means of which contact layer the pump radiation source 20 can be electrically contact-connected on the p-type side. That is to say that when the mask layer 18 has cutouts, the p-type contact layer 19 contact-connects the covering layer 16 and defines the contact-connected regions 31 in this way.

An n-type contact layer 22 is applied on the underside of the substrate 1.

In this case, the main area 23 of the substrate 1 that is remote from the semiconductor structure is not covered by the n-type contact layer 22 in an exit window 24 for the laser beam (indicated by the arrow 25).

A laser resonator of the surface emitting structure 3 may be formed from the Bragg mirror 8 and a further mirror (not illustrated) arranged on the opposite side of the substrate 1, or a further Bragg mirror arranged between substrate 1 and quantum well structure 4.

During operation of the semiconductor laser device, pump radiation (indicated by the arrows 26) is generated by the contact-connected regions 31 of the edge emitting semiconductor structure 9, a part of said pump radiation being coupled into the quantum well structure 4. Laser radiation is preferably generated in the pump radiation source 20, which leads to an increase in the pump efficiency. Particularly preferably, the intensity distribution of the pump radiation transversely with respect to the emission direction in the lateral direction follows a predeterminable curve.

The end mirrors 17 are preferably arranged relative to one another in such a way that they form a laser resonator for two mutually opposite radiation emitting regions of the edge emitting structure 9. The two opposite radiation emitting regions of the edge emitting structure 9 are then coupled, after the transparent pumping of the surface emitting laser structure 3, to form a single coherently oscillating laser.

Figure 2:
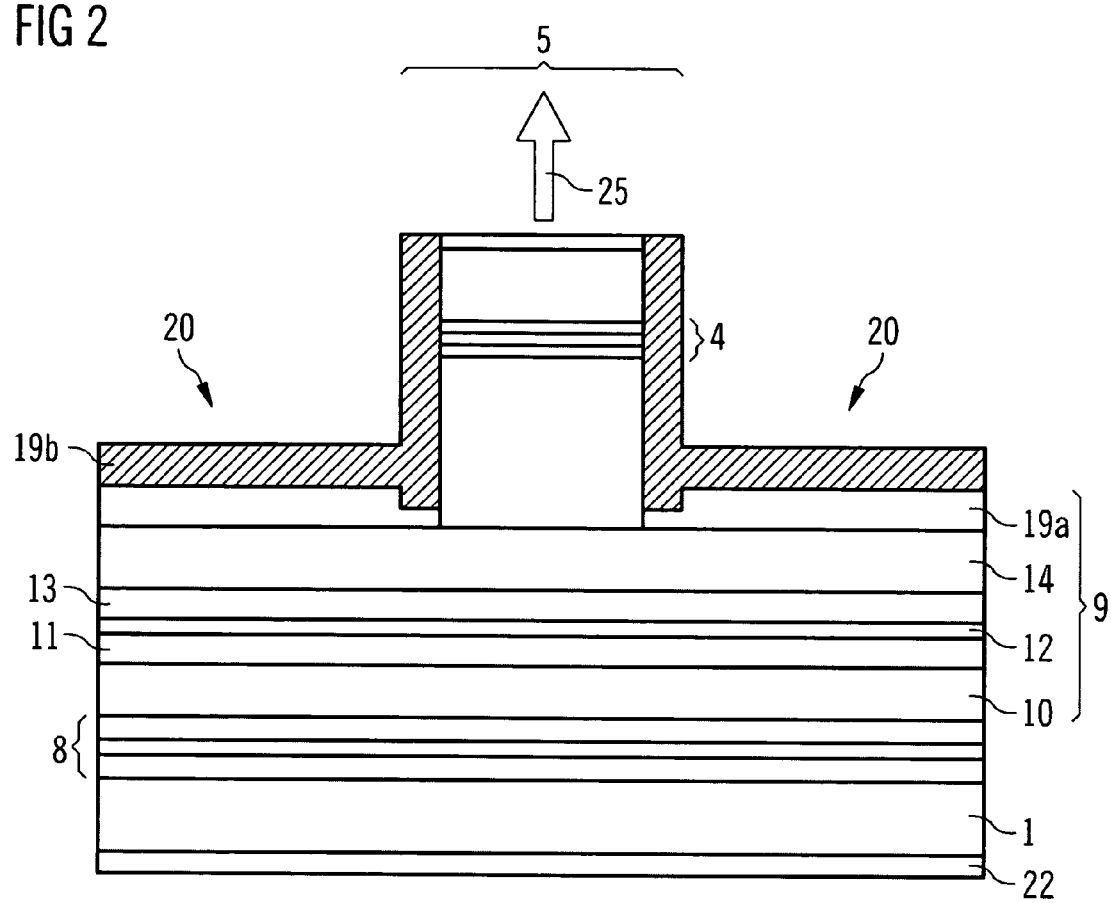
FIG. 2 shows a schematic illustration of a cross section taken through a second exemplary embodiment of the surface emitting semiconductor laser device.

FIG. 2 shows a schematic illustration of a section through a second exemplary embodiment of the surface emitting semiconductor device.

A disk laser grown by single-step epitaxy is shown here, in the case of which the pump radiation is coupled upward into the quantum well structure 4 of the surface emitting laser 5, which contains a multiplicity of quantum wells, for example. In this case, the coupling into the quantum well structure 4 is effected for example on the basis of jumps in the refractive index of the waveguide layers 11, 13.

The pump laser 20 is provided by optically coupled edge emitters 9, for example. The laser facets of the pump laser 20 are preferably produced by scribing and breaking along the crystallographic axes of the semiconductor substrate 1 and subsequent mirror-coating with high reflectivity (R>90%). As a result, at most a small proportion of the pump radiation is coupled out from the lateral resonator. By means of the resonator-internal surface emitting laser 5, an efficient optical pump mechanism is realized through the absorption of the pump radiation 26 in the quantum well structure.

In this case, the advantage of this exemplary embodiment resides in the particularly simple embodiment in terms of production technology. After the epitaxy, in the region of the pump laser 20, etching into the waveguide is effected by selective etching in a defined manner by means of an etching stop layer and a transparent conductive p-type contact 19a, which may contain ZnO, for example, and a p-type contact metalization 19b, which preferably also serves as metallic reflector for the pump light, are subsequently applied. The p-type contact metalization 19a, 19b is preferably patterned in the region of the edge emitter 9 in such a way that contact-connected regions 31 are defined. This may again be realized by means of a mask layer, for example.

FIG. 3 shows a schematic illustration of a plan view of a semiconductor laser device, comprising a surface emitting laser region 5 with a surface emitting semiconductor structure 3 and a pump radiation source 20 with a contact-connected area 31 according to the prior art. The pump radiation source 20 is in this case formed by, for example, a broad-stripe laser that is contact-connected in large-area fashion. By virtue of the fact that the pump radiation source 20 is covered on the p-type side with a homogeneously contact-connected area 31 that completely or approximately completely covers the top side of the pump radiation source, the active zone 12 of the edge emitter 15 is energized homogeneously. This homogeneous energization of the active zone 12 has the effect that the laser emission of the pump radiation source 20 in the lateral direction (the lateral direction is indicated by the arrow y in FIG. 3) constitutes a superposition of many modes whose sum forms an approximately rectangular intensity profile in the y direction.

It holds true for the surface emitting laser region 5, also referred to herein as vertical emitter 5, that the emission power profile is given to an approximation by $$P = \eta_{vertical}(P_{abs} - P_{th,\,vertical}).$$

In this case, $\eta_{vertical}$ designates a proportionality constant for the vertical emitter 5, $p_{abs}$ is the absorption profile of the power absorbed by the surface emitting structure 4, and $P_{th,\,vertical}$ is a threshold power which specifies the pump power from which the laser generation commences. That is to say that the emission power of the vertical emitter 5 is determined essentially by its absorption profile. This relates both to the spatial distribution and to the magnitude of the absorbed power. The absorption profile in turn reproduces the gain profile, i.e. the spatial distribution of charge carriers in the surface emitting semiconductor structure 3.

A contact-connection 31 of the pump radiation source 20 according to FIG. 3 thus leads to an approximately rectangular intensity profile of the emitted pump radiation 26. This in turn leads to an absorption profile in the vertical emitter 5 according to FIG. 9. In this case, the pump radiation sources 20 may also be arranged perpendicular to one another, as shown for example in FIG. 7.

Figure 9:
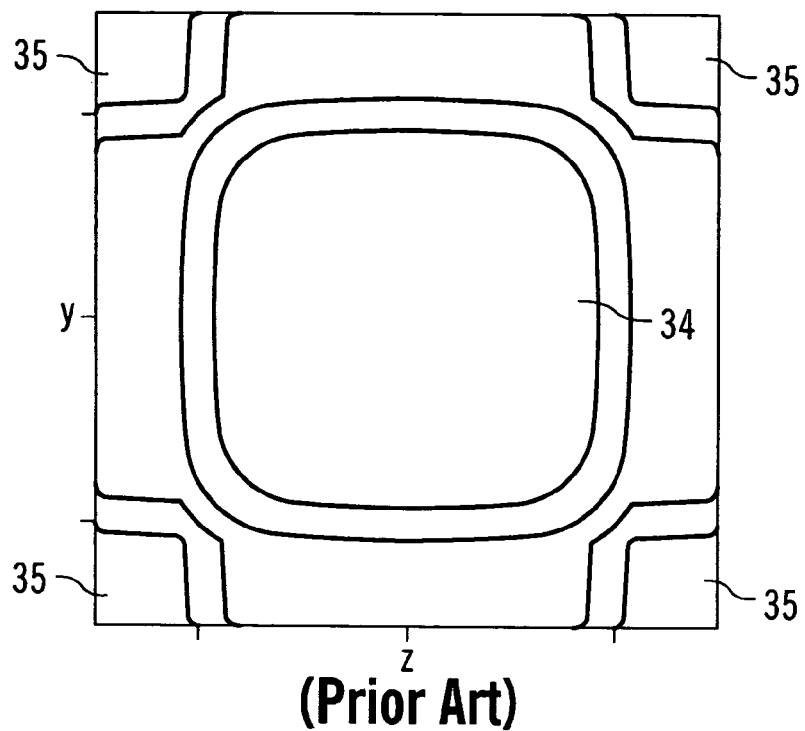
FIG. 9 shows an absorption profile of a surface emitting structure which is pumped by means of a pump radiation source according to the prior art.

FIG. 9 shows an absorption profile $p_{abs}$ of a surface emitting semiconductor structure 3. It can be seen from FIG. 9 that, on account of the rectangular pump profile, the absorption profile is also rectangular. As a result of this, many different transverse modes establish oscillation in the vertical emitter 5, the superposition of which generates a rather rectangular emission power profile. The spatial distribution of the absorbed power is represented by contour lines in this case. The absorbed power is greatest in the center 34 of the surface emitting structure 3. However, at the edges 35 of the surface emitting structure 3 there are also regions in which a relatively large amount of power is absorbed.

Since the absorption profile determines the beam profile of the vertical emitter 5, the present absorption profile leads to a rather rectangular beam profile with a relatively low power density. The emission power of the vertical emitter is distributed within a relatively large area. If the vertical emitter is pumped with higher power, pumping is effected not only into the fundamental mode but also into higher transverse modes.

FIG. 4 shows a schematic illustration of a plan view of a semiconductor laser device with an edge emitting pump radiation source 20, the contact-connected area 31 of which is formed as striplike regions 41. In this case, the strips 41 extend in the direction of the emission direction of the pump radiation source 20. Situated between the contact-connected areas 31 of the strips 41 are non-contact-connected areas that are defined for example by the correspondingly patterned insulating mask layer 18. When moving over the surface of the pump radiation source 20 from the outside toward the center, contact-connected regions and non-contact-connected regions alternate. Thereby, the strips 41 are thicker the nearer they are located to the center of pump radiation source 20. On account of the patterning of the contact-connected area 31 in the lateral direction, the active zone 12 of the pump radiation source 20 is also not energized homogeneously in the lateral direction. In the present exemplary embodiment, as a result of wider strips 41 in the center and narrower strips 41 at the edges of the pump radiation source, more current is impressed into the center of the active zone 12 than into its edges. The number, width and spacing of the contact-connected strips 41 can be adapted to the desired energization profile in the active zone 12. A desired profile of the current density in the lateral direction in the active zone 12 can thus advantageously be generated by way of the choice of the strip width and the spacing of the strips 41. Through gain guiding, the profile of the current density in the active zone 12 leads to a desired intensity profile of the emitted pump radiation 26 in the lateral direction.

It proves to be particularly advantageous if the strips 41 follow a Gaussian distribution in terms of their width and distribution, with a strip width maximum approximately in the center of the pump radiation source. As a result of this strip geometry, a current profile that approximately follows a Gaussian distribution in the y direction is impressed into the active zone 12 of the pump radiation source 20. The modes in the edge emitter are then superposed in such a way that the pump radiation source emits radiation with a Gaussian intensity profile in the lateral direction. An approximately Gaussian profile then results as the absorption profile in the vertical emitter 5.

Figure 10:
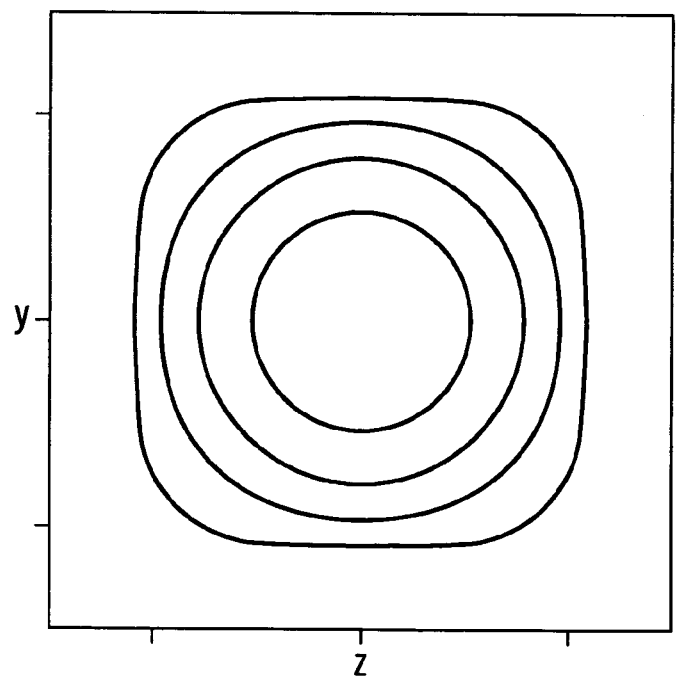
FIG. 10 shows an absorption profile of a surface emitting structure which is pumped by means of a pump radiation source in accordance with one of the exemplary embodiments of the semiconductor laser device described.

FIG. 10 shows that the absorption profile is radially symmetrical and essentially Gaussian in this case in the vertical emitter 5. Primarily the radially symmetrical transverse fundamental mode therefore establishes oscillation. Pumping is thus effected into this mode in a targeted manner as a result of the Gaussian intensity distribution of the pump radiation. It is particularly advantageous in this case that even in the event of an increase in the pump power of the pump radiation source 20, pumping is effected only into the fundamental mode and, therefore, higher modes hardly establish oscillation or do not establish oscillation at all. The radially symmetrical absorption profile of the vertical emitter is thus preserved even with a higher pump power. In this way, a laser beam having a particularly good beam quality can be generated by means of the vertical emitter. This laser beam has a radially symmetrical beam profile with a high power density.

FIG. 5 shows a further exemplary embodiment of the semiconductor laser device. In this case, the pump radiation source has a contact-connected area in such a way that, averaged over the resonator length of the pump radiation source 20, a current is impressed into the active zone 12, so that a Gaussian current density results for example in the lateral direction. As shown in FIG. 5, averaged over the length of the resonator, more contact-connected area is situated in the center of the top side of the pump radiation source than at the edges thereof. The proportion of the total area made up by the contact-connected area thus increases when moving over the surface transversely with respect to the emission direction, that is to say in the y direction, from the outside toward the center. This is achieved for example by virtue of the fact that, as shown in FIG. 5, a plurality of non-contact-connected regions are arranged on the surface of the edge emitter. The width of the non-contact-connected regions respectively decreases from the edge toward the center of the surface.

Numerous further patternings of the contact-connected area are conceivable in addition to the exemplary embodiments of FIGS. 4 and 5. Depending on the chosen patterning of the contact-connected area, a specific current density can be impressed into the active zone 12, which in turn leads to a predefined intensity distribution of the radiation emitted by the edge emitting semiconductor structure 9. Thus, by way of example, it is possible to generate intensity profiles with two or more local maxima. In this way, it is possible to pump, in a targeted manner, specific higher transverse modes of the vertical emitter 5. Beam profiles of the vertical emitter 5 which have a plurality of local maxima can thus be generated.

Figure 6:
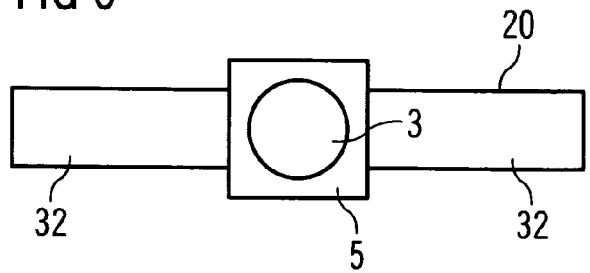
FIG. 6 shows a schematic illustration of a plan view of a semiconductor laser device according to a second exemplary embodiment.
Figure 7:
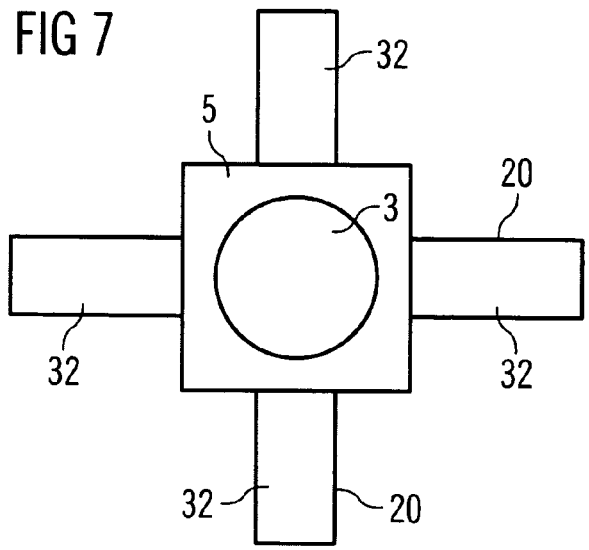
FIG. 7 shows a schematic illustration of a plan view of a semiconductor laser device according to a third exemplary embodiment.
Figure 8:
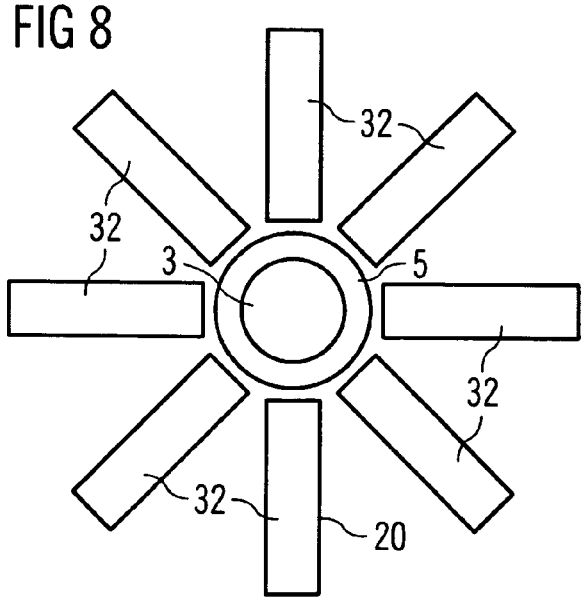
FIG. 8 shows a schematic illustration of a plan view of a semiconductor laser device according to a fourth exemplary embodiment.

FIGS. 6, 7 and 8 show various possibilities for the arrangement of the pump radiation sources 20 around the vertical emitter 5. In this case, the pump radiation sources 20 have top sides 32 with the patterned contact-connected areas 31 described in FIGS. 4 and 5, by way of example. Through the number and arrangement of the pump radiation sources 20, an additional possibility for setting the absorption profile in the vertical emitter 5 is afforded by superposition of the radiation from the individual pump radiation sources.

The invention is not restricted by the description on the basis of the exemplary embodiments. Rather, the invention encompasses any new feature and also any combination of features, which comprises in particular any combination of features in the patent claims, even if this feature or this combination itself is not explicitly specified in the patent claims or exemplary embodiments.

We claim:

1. A surface emitting inorganic semiconductor laser device, comprising:
    at least one monolithically integrated pump radiation source having:
        at least one edge emitting semiconductor structure with an active zone and at least one surface, wherein a contact-connected area is connected to the at least one surface so that the proportion of the total area of the at least one surface that is connected to the contact-connected area varies when moving over the at least one surface transversely from an outer side of the at least one surface to a center of the at least one surface with respect to an emission direction (z) of the semiconductor structure;
    wherein the contact-connected area comprises at least two strip-shaped contact-connected regions that are disposed at a distance from one another and extend along the emission direction (z);
    wherein said at least two strip-shaped contact-connected regions are configured for an electrical current to be impressed therethrough and into the active zone;
    wherein the at least one edge emitting semiconductor structure is configured to emit electromagnetic radiation that has an intensity profile that transversely follows a predeterminable curve with respect to the emission direction (z) of the semiconductor structure;
    wherein means for inhomogeneous energization of specific regions of an active zone of the semiconductor structure are provided, the inhomogeneity relating to a direction transversely with respect to the emission direction (z) of the semiconductor structure; and
    wherein means for energization are provided in such a way that the current density in the active zone transversely with respect to the emission direction (z), averaged over the resonator length of the semiconductor structure, follows a predeterminable curve.

2. The surface emitting semiconductor laser device as claimed in claim 1, in which the intensity profile has at least one local maximum.

3. The surface emitting semiconductor laser device as claimed in claim 1, in which the intensity profile proceeds in the manner of a bell-shaped curve.

4. The surface emitting semiconductor laser device as claimed in claim 1, in which the width of the strip-shaped contact-connected regions decreases from an axis of the semiconductor structure parallel to the emission direction (z) outward.

5. The surface emitting semiconductor laser device as claimed in claim 1, in which the distance between the strip-shaped contact-connected regions increases from a center axis outward.

6. The surface emitting semiconductor laser device as claimed in claim 1, in which the width of the strip-shaped contact-connected regions decreases from a center axis outward and the distance between the strip-shaped contact-connected regions increases from the center axis outward.

7. The surface emitting semiconductor laser device as claimed in claim 1, wherein the at least one surface of the edge emitting semiconductor structure comprises at least two non-contact-connected regions, and wherein the width of the non-contact-connected regions decreases from an edge of the at least one surface toward a center of the at least one surface.

8. The surface emitting semiconductor laser device as claimed in claim 1, wherein the at least two strip-shaped contact-connected regions are disposed at a constant distance from one another and extend along the emission direction (z) such that the two lateral edges of one of the at least two strip-shaped contact-connected regions are parallel to the two lateral edges of the other one of the at least two strip-shaped contact-connected regions.

9. A surface emitting inorganic semiconductor laser device, comprising:
    at least one monolithically integrated pump radiation source having:
        at least one edge emitting semiconductor structure with an active zone and at least one surface, wherein a contact-connected area is connected to the at least one surface so that the proportion of the total area of the at least one surface that is connected to the contact-connected area varies when moving over the at least one surface transversely from an outer side of the at least one surface to a center of the at least one surface with respect to an emission direction (z) of the semiconductor structure;

wherein the contact-connected area comprises at least two strip-shaped contact-connected regions that are disposed at a distance from one another and extend along the emission direction (z);

wherein said at least two strip-shaped contact-connected regions are configured for an electrical current to be impressed therethrough and into the active zone; and wherein the at least one edge emitting semiconductor structure is configured to emit electromagnetic radiation that has an intensity profile that transversely follows a predeterminable curve with respect to the emission direction (z) of the semiconductor structure; and wherein the distance between the strip-shaped contact-connected regions increases from a center axis outward.

10. A surface emitting inorganic semiconductor laser device, comprising:

at least one monolithically integrated pump radiation source having:

at least one edge emitting semiconductor structure with an active zone and at least one surface, wherein a contact-connected area is connected to the at least one surface so that the proportion of the total area of the at least one surface that is connected to the contact-connected area varies when moving over the at least one surface transversely from an outer side of the at least one surface to a center of the at least one surface with respect to an emission direction (z) of the semiconductor structure;

wherein the contact-connected area comprises at least two strip-shaped contact-connected regions that are disposed at a distance from one another and extend along the emission direction (z);

wherein said at least two strip-shaped contact-connected regions are configured for an electrical current to be impressed therethrough and into the active zone; and wherein the at least one edge emitting semiconductor structure is configured to emit electromagnetic radiation that has an intensity profile that transversely follows a predeterminable curve with respect to the emission direction (z) of the semiconductor structure; and wherein the width of the strip-shaped contact-connected regions decreases from a center axis outward and the distance between the strip-shaped contact-connected regions increases from the center axis outward.

11. A surface emitting inorganic semiconductor laser device, comprising:

at least one monolithically integrated pump radiation source having:

at least one edge emitting semiconductor structure with an active zone and at least one surface, wherein a contact-connected area is connected to the at least one surface so that the proportion of the total area of the at least one surface that is connected to the contact-connected area varies when moving over the at least one surface transversely from an outer side of the at least one surface to a center of the at least one surface with respect to an emission direction (z) of the semiconductor structure;

wherein the contact-connected area comprises at least two strip-shaped contact-connected regions that are disposed at a distance from one another and extend along the emission direction (z);

wherein said at least two strip-shaped contact-connected regions are configured for an electrical current to be impressed therethrough and into the active zone; and wherein the at least one edge emitting semiconductor structure is configured to emit electromagnetic radiation that has an intensity profile that transversely follows a predeterminable curve with respect to the emission direction (z) of the semiconductor structure; and wherein the at least one surface of the edge emitting semiconductor structure comprises at least two non-contact-connected regions, and wherein the width of the non-contact-connected regions decreases from an edge of the at least one surface toward a center of the at least one surface.

12. A surface emitting inorganic semiconductor laser device, comprising:

at least one monolithically integrated pump radiation source having:

at least one edge emitting semiconductor structure with an active zone and at least one surface, wherein a contact-connected area is connected to the at least one surface so that the proportion of the total area of the at least one surface that is connected to the contact-connected area varies when moving over the at least one surface transversely from an outer side of the at least one surface to a center of the at least one surface with respect to an emission direction (z) of the semiconductor structure;

wherein the contact-connected area comprises at least two strip-shaped contact-connected regions that are disposed at a distance from one another and extend along the emission direction (z);

wherein said at least two strip-shaped contact-connected regions are configured for an electrical current to be impressed therethrough and into the active zone;

wherein the at least one edge emitting semiconductor structure is configured to emit electromagnetic radiation that has an intensity profile that transversely follows a predeterminable curve with respect to the emission direction (z) of the semiconductor structure;

wherein means for inhomogeneous energization of specific regions of an active zone of the semiconductor structure are provided, the inhomogeneity relating to a direction transversely with respect to the emission direction (z) of the semiconductor structure; and wherein means for energization are provided in such a way that the current density in the active zone transversely with respect to the emission direction follows a predeterminable curve.

13. The surface emitting semiconductor laser device as claimed in claim 12, in which means for energization are provided in such a way that the current density in the active zone transversely with respect to the emission direction (z) follows a curve with at least one local maximum.

14. The surface emitting semiconductor laser device as claimed in claim 12, in which the current density in the active zone transversely with respect to the emission direction (z) proceeds in the manner of a bell-shaped curve.

* * * * *